United States Patent [19] Janes

[11] 4,159,421

[45] Jun. 26, 1979

[54] METHOD AND APPARATUS FOR SUPPRESSING ELECTRON GENERATION IN A VAPOR SOURCE FOR ISOTOPE SEPARATION

[75] Inventor: George S. Janes, Lincoln, Mass.

[73] Assignee: Jersey Nuclear-Avco Isotopes, Inc., Bellevue, Wash.

[21] Appl. No.: 765,675

[22] Filed: Feb. 4, 1977

[51] Int. Cl.[2] .......... H01J 37/00
[52] U.S. Cl. .......... 250/423 P
[58] Field of Search .......... 250/423 P, 423 R, 288, 250/281, 282

[56] References Cited

U.S. PATENT DOCUMENTS

| | | | |
|---|---|---|---|
| 3,294,970 | 12/1966 | Jenckel | 250/423 |
| 3,462,595 | 3/1969 | Brown | 250/423 |
| 3,479,545 | 11/1969 | Wilson et al. | 250/423 |
| 3,846,668 | 11/1974 | Ehlers et al. | 250/423 |
| 4,000,421 | 12/1976 | Janes et al. | 250/423 P |

*Primary Examiner*—Alfred E. Smith
*Assistant Examiner*—B. C. Andersen
*Attorney, Agent, or Firm*—Weingarten, Maxham & Schurgin

[57] ABSTRACT

A system for applying accelerating forces to ionized particles of a vapor in a manner to suppress the flow of electron current from the vapor source. The accelerating forces are applied as an electric field in a configuration orthogonal to a magnetic field. The electric field is applied between one or more anodes in the plasma and one or more cathodes operated as electron emitting surfaces. The circuit for applying the electric field floats the cathodes with respect to the vapor source, thereby removing the vapor source from the circuit of electron flow through the plasma and suppressing the flow of electrons from the vapor source. The potential of other conducting structures contacting the plasma is controlled at or permitted to seek a level which further suppresses the flow of electron currents from the vapor source. Reducing the flow of electrons from the vapor source is particularly useful where the vapor is ionized with isotopic selectivity because it avoids superenergization of the vapor by the electron current.

28 Claims, 6 Drawing Figures

FIG. 1
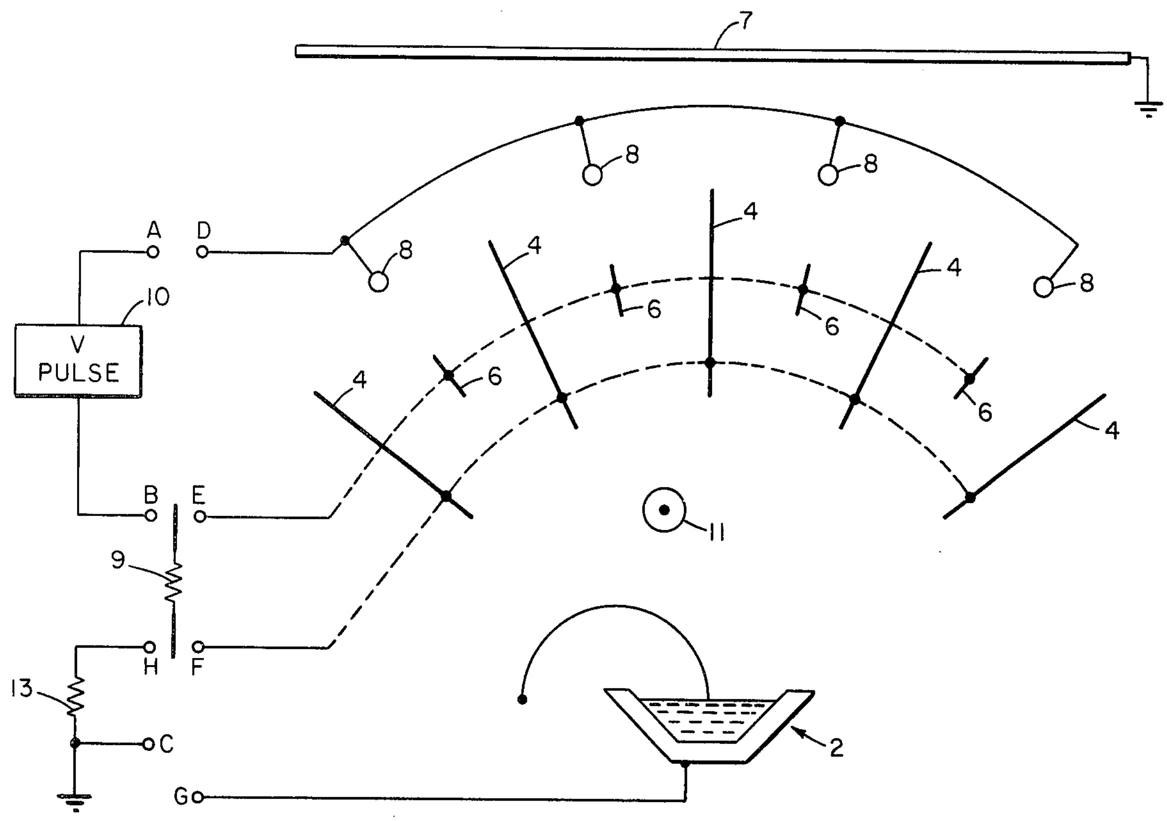
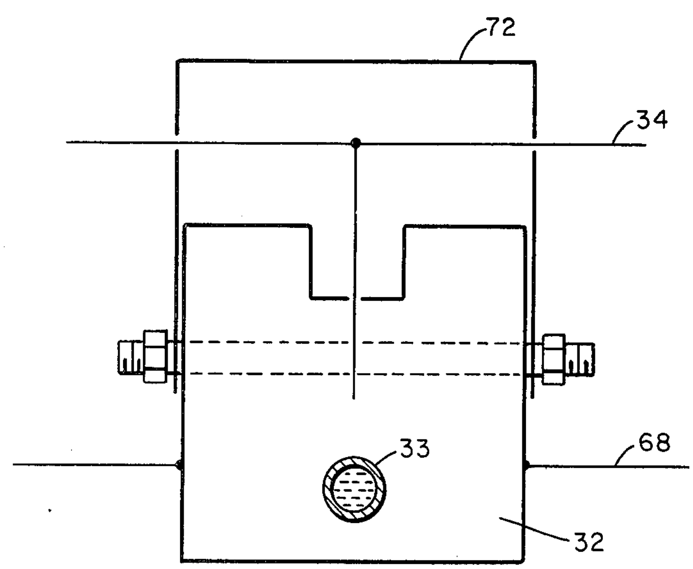
FIG. 2A

FIG. 2
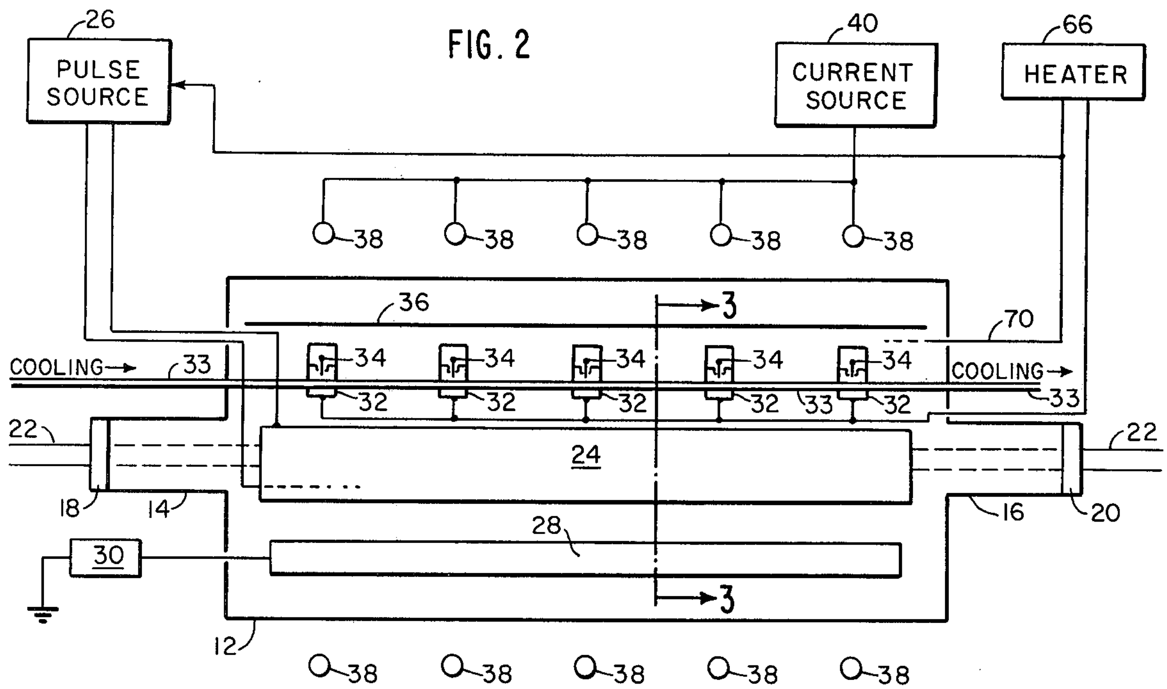
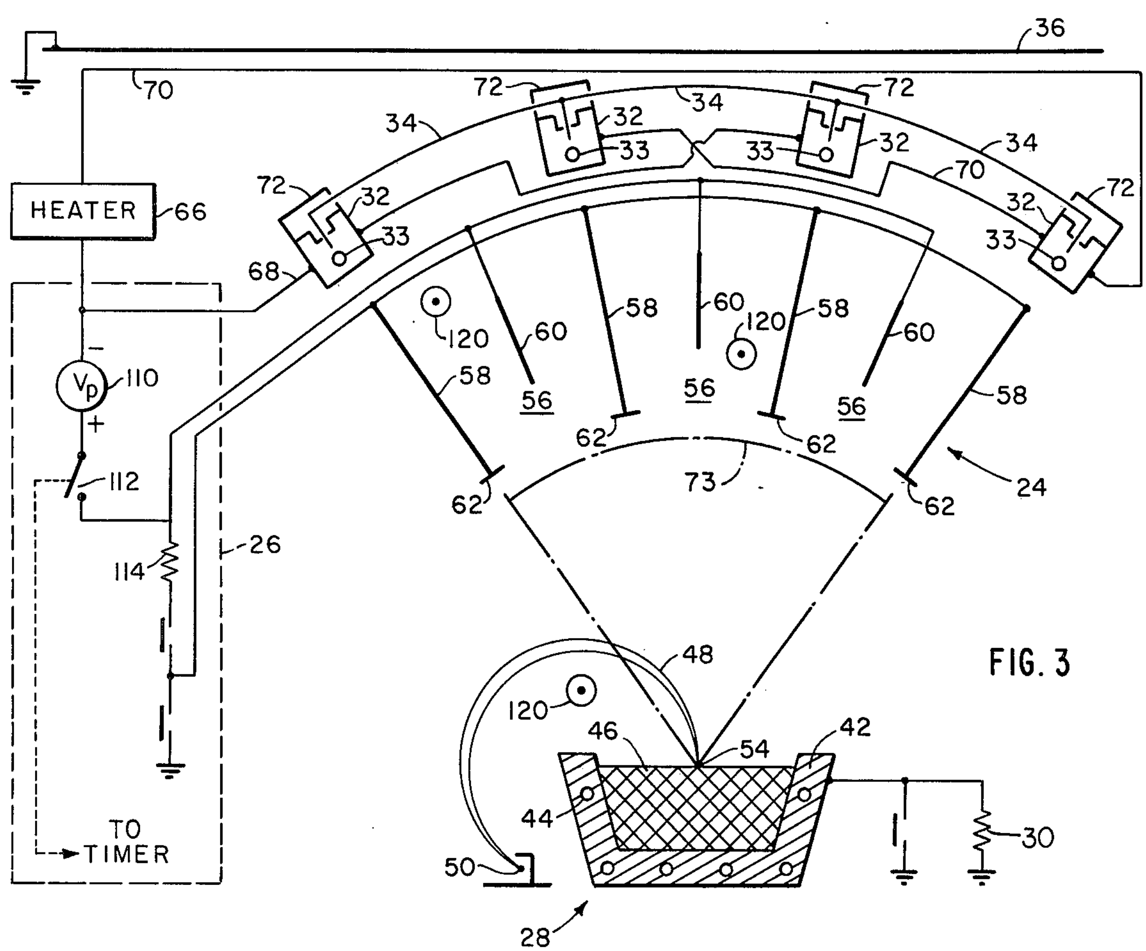
FIG. 3

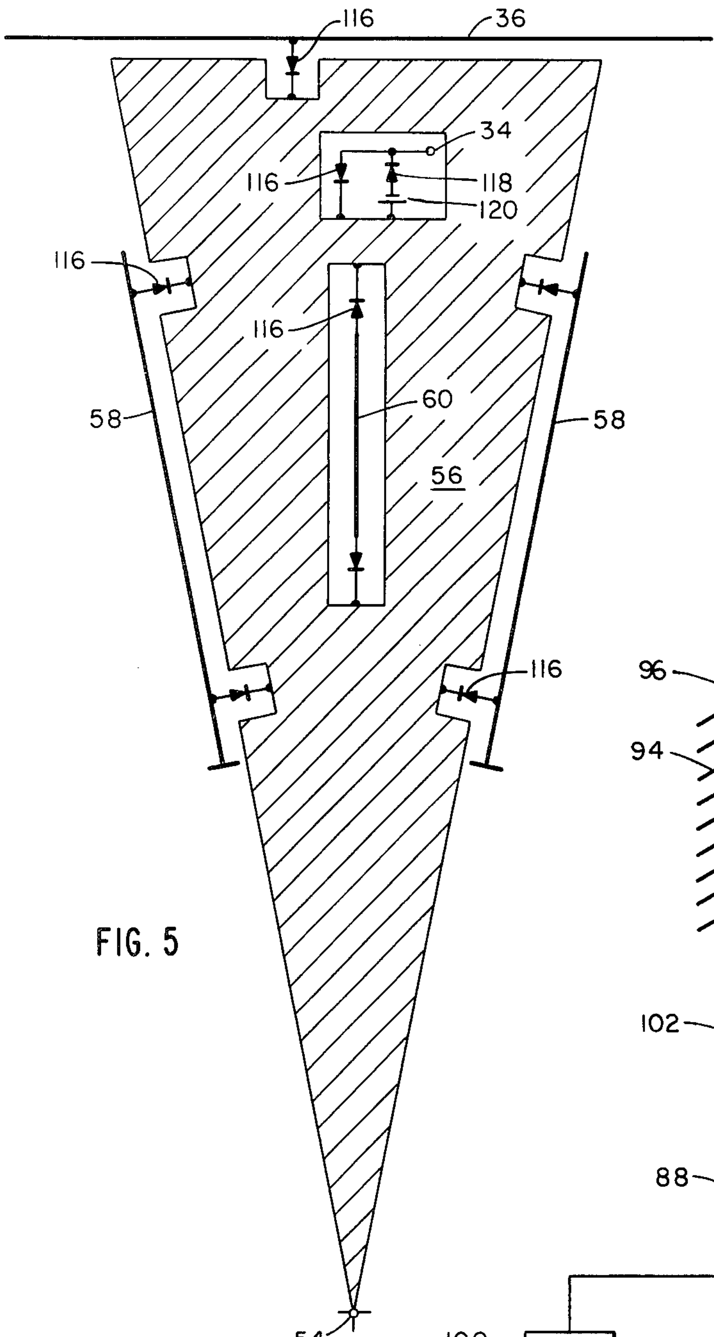
FIG. 5
FIG. 4
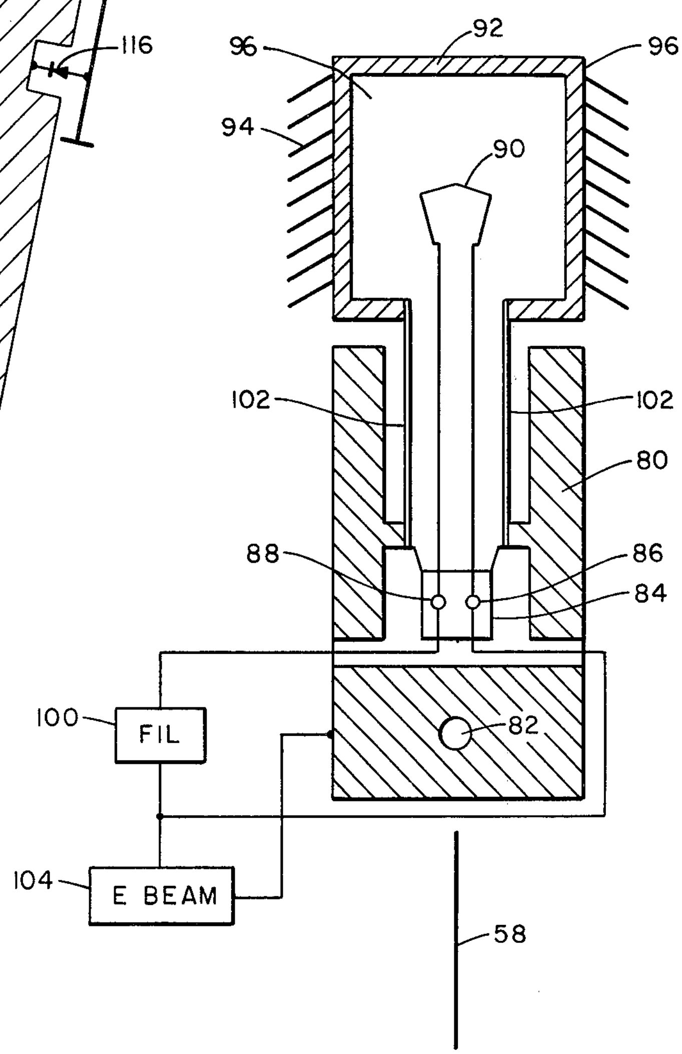

METHOD AND APPARATUS FOR SUPPRESSING ELECTRON GENERATION IN A VAPOR SOURCE FOR ISOTOPE SEPARATION

FIELD OF THE INVENTION

The present invention relates to the application of an electric potential to a plasma and in particular to applying the potential in a manner to suppress the flow of electron currents from other structures contacting the plasma.

BACKGROUND OF THE INVENTION

In the technique of uranium enrichment by photoexciting and ionizing a selected isotopic component of a vapor, typically generated by heating or electron beam techniques, it has been suggested that the selectively ionized particles are preferably collected from the ionized vapor or plasma by crossed-field, magnetohydrodynamic, effects. Such a system is disclosed, for example, in U.S. Pat. No. 3,939,345, assigned to the same assignee as the present application and incorporated herein by reference. The technique there shown employs the application of a pulsed electric field to the plasma in the presence of an orthogonally directed magnetic field resulting in the acceleration of plasma ions onto trajectories which permit their separate collection apart from the plasma. The electric field is typically applied between a set of plates forming a plurality of U-shaped channel members acting as a cathode with an anode placed centrally within each chamber. A vapor of uranium, including the isotopes to be separated, is then directed into the chambers where they are selectively ionized by isotope type and subjected to the accelerating forces.

The vapor source, typically an electron beam source or induction oven acts as an efficient supplier of electrons to the plasma. Electrons are desired in order to permit the action of the magnetohydrodynamic acceleration forces to direct the ionized particles for collection onto the plates of the cathode. While an additional, filamentary source of electrons may be provided in the plasma the vapor source typically functions as a dominant source of electrons. Because the electrons travel with the vapor, from the point of generation out to the chambers where selective ionization and extraction is achieved, there is a significant probability of interacting with vapor particles resulting in excitation of the vapor particles from the ground or other low-lying energy states. Accordingly, a significant number of the particles in the vapor reaching the chambers are no longer in the ground or other very low-lying energy states to which excitation radiation in the form of laser beams is tuned for isotopically selective photoexcitation. As a result, the portion of those energized particles which are of the desired isotope are not available for photoexcitation and ultimate collection on the plates as enriched fraction. The unavailability of the significant number of these particles serves to reduce the efficiency of the process beyond what might otherwise be achieved.

Additionally, the presence of numbers of energetic electrons increases the chance of de-excitation collisions with excited state particles, reducing the excited state life time and lowering system enrichment efficiency.

BRIEF SUMMARY OF THE INVENTION

In accordance with the teaching of the present invention a system is presented for applying an electric potential to the plasma between an anode and a cathode with the cathode functioning as a source of electrons and with the potentials of the other structures which contact the plasma arranged at or permitted to seek potentials which suppress the flow of and electron current from other sources that could result in unwanted de-excitation and energization of the vapor particles.

In particular, where the vapor to be ionized is produced by a vaporization of a conductive metal, such as uranium, the vapor source can act as a supply of electrons. This is avoided in accordance with the teaching of the present invention by floating or nearly floating the circuit formed between the anode and the cathode with respect to the vapor source. By isolating the vapor source from the circuit applying extraction forces to the plasma, the electrons generated by the vapor source effectively are not a part of that circuit. The potentials on the vapor source and the cathode and anode contacting the plasma work themselves out to effectively reduce the flow of electrons from the vapor source.

Additional suppression can be achieved by floating the plates defining the chambers around each anode as well as the vapor source not only from the circuitry applying the extraction forces but from circuit common or the ground potential of the system enclosure.

The effect of this technique is to greatly reduce the flow of unwanted electron currents from various points within the vapor prior to photexcitation and ionization resulting in an improvement in the percentage of particles of the desired isotope type available in the ground and low-lying energy states for selective photoexcitation and ionization. With more particles available and thus selectively ionized and extracted, over-all system throughput and efficiency is increased.

DESCRIPTION OF THE DRAWING

These and other features of the present invention are more fully set forth below in the detalied description presented solely for purposes of illustration and not by way of limitation, and in the accompanying drawing of which:

FIG. 1 is a simplified diagram of a module for uranium enrichment in which the present invention is useful;

FIG. 2 is a side diagrammatic view of apparatus with which the present invention is employed;

FIG. 2A is an expanded view of a portion of FIG. 2;

FIG. 3 is an interior sectional diagrammatic view of the apparatus of FIG. 2;

FIG. 4 is a sectional view of an alternative cathode and electron emitter for use in the invention of FIGS. 1 and 2; and FIG. 5 is a view of a portion of the apparatus of FIG. 2 indicating a partial equivalent circuit useful in explaining the operations of FIGS. 1, 2 and 3.

DETAILED DESCRIPTION OF THE INVENTION

There is provided in the present invention circuitry for applying an accelerating force within a plasma environment in a manner to control the flow of electrons so that they are not drawn from sources resulting in undesired plasma excitation. The present invention is preferably operative within a system for isotope separation, particularly uranium enrichment, wherein a vapor of uranium is generated and directed into a region where it is selectively ionized and accelerated onto trajectories for collection apart from the vapor. The vapor source is capable of operating as an efficient source of electrons but is prevented from providing electrons to the plasma by the manner in whih the accelerating forces are applied to the plasma. An alternate electron supply is provided to replace the vapor source as an electron supply for the plasma, and to provide the electrons without producing overexcitation of the vapor depleting the ground or low-lying energy states. There are thus provided a greater number of particles available for selective ionization.

With reference to the drawing, and in particular to FIG. 1, the context of the invention for use in uranium enrichment is illustrated in a simplified form corresponding generally to the teaching of U.S. Pat. No. 3,939,354 noted above. For such application, a uranium vapor source 2, such as an electron beam evaporator, is provided to generate a radially expanding flow of uranium vapor. The vapor flow is directed between an array of plates 4 which are oriented parallel to the flow direction. The plates 4 have between them a further plate or anode electrode 6 also parallel or generally providing a low profile to the flow direction. Typically, a voltage pulse source 10 is provided to pulse the anode electrode 6 positive with respect to the plasma in order to cause electrons to circulate about the anode electrodes 6 in the presence of an orthogonal magnetic field 11. For this purpose, pulse source 10 is typically connected through its output terminals A and B to terminals E and F respectively which contact the plates 4 and 6. Cathodes 8 which may be filaments or separately heated electron emitters are also provided to supply conduction electrons to the region between the plates 4 and 6. These electrons assist in providing sufficient electron conduction to maintain the electric field for effective extraction of the selectively ionized particles.

Typically, plates 4 are grounded along with the vapor source 2 such as by connecting terminals F and G to ground via terminal C. In this, or other configurations, the vapor source 2 is connected into a point of the circuit which includes the plates 4 and 6. This encourages a substantial flux of electrons in the vapor from source 2 to the electrode structures, particularly plates 6 where they enter into circuit. Electrons in the region of selective ionization are necessary for effective operation of the crossed-field MHD acceleration effects, but the forced flow of substantial numbers of electrons from the vapor source 2, with the vapor, is not desired since it results in electron impact energization or de-energization of the vapor particles thereby eliminating them from the supply of particles available for selective excitation and ionization. The cathodes 8 are provided to act as auxiliary sources of electrons, but unless the cathodes are slightly negative relative to the vapor source 2, space charges and other effects prevent them from substantially replacing the flow of electrons from the vapor source 2.

In order to achieve a suppression of the flow of electrons from the vapor source 2 in favor of electrons from cathodes 8, potentials are adjusted or permitted to assume values on the various elements contacting the vapor environment which eliminates the vapor source from the electron flow circuit. To prevent the flow of electrons from the vapor source 2 and favor the provisions of electrons from the cathodes 8, the electric field pulses are applied to the plasma independently of the major structural elements contacting the vapor such as plates 4 and 7 and source 2. The plates 6 and cathodes 8 are then energized for producing the ion accelerating force pulses from source 10 by connecting terminals D and E to terminals A and B respectively, with terminal F, plates 4, typically grounded. None of the terminals A, B, D and E are then grounded thus permitting the cathodes 8, the alternate electron source, to float. Since the vapor source is thus not in circuit with the plates 6 and cathodes 8, a circuit for the flow of electrons from vapor source 2 is not completed and potentials in the regions between plates 4 and 6 will be established which inhibit an electron current from flowing from the source 2.

There may still be some electron current from the vapor source, however, as a result of electrons from cathodes 8 which flow to ground through plates 4. This current permits electrons to flow from ground via the vapor source 2 to the anode plates 6. This effective current from the source 2 may be further reduced by floating the product plates 4 by leaving terminal F unconnected, or by additionally connecting the product plates 4 to the anode plates 6 through a large value, current limiting resistor 9 across terminals E and F.

Electrons may still flow from the vapor source 2 to other elements in the vapor environment such as grounded rear plates 7 used for the collection of the un-ionized particles. This current may also be suppressed by floating the vapor source 2 as by insulating it from the rest of the separation structure, i.e. leaving terminal G unconnected or by connecting terminal G to terminal H so as to ground the vapor source 2 through a limiting resistor 13.

The application of the accelerating voltages between cathodes 8 and electrodes 6 also permits the retention of the effect of electron circulation about electrodes 6 as described in the above-referenced U.S. Pat. No. 3,939,354. This is so because the plates 4 are floated with respect to electrodes 6 and cathodes 8 so that they do not hinder the formation of successive equipotential surfaces about electrodes 6 toward plates 4 along which the electrons travel during pulsing of the electric field. The plates 4 thus merely occupy an equipotential surface wih only slight field distortion. The application of the electric field to the plasma other than directly between plates 4 and electrodes 6 is thus an important feature of the present system.

The detailed structure and operation of the present invention may best be understood by reference to the remaining figures beginning initially with FIG. 2 showing a side view of an isotopically selective ionization and ion extraction system within which the present invention is useful. As shown there, a stainless steel chamber 12, typically grounded, of the type illustrated above and in U.S. Pat. No. 3,939,354, commonly assigned and incorporated herein by reference, is evacuated to a relatively low pressure of approximately $10^{-5}$ torr. The chamber 12 has extension pipes 14 and 16 on opposite ends into which are fitted optical quality windows 18 and 20 to receive and pass a composite laser beam 22. Beam 22 is adapted for isotopically selective photoionization of the vapor between a set of extraction plates 24 which are activated by a pulse source 26 in response to a timer (not shown) all as indicated in the above-referenced patent. The extractor plates 24 are positioned above a uranium vapor source 28 which is typically an electron beam vapor source and which is connected either directly or through an impedance 30 to ground. Directly above the extractor plates 24 are a series of conductive blocks 32 supported on cooling tubes 33 which run within the chamber 12 the length of the extractor plates 24. Each block 32 supports a filament 34, typically of tungsten, running into and out of the page above the plates 24. The five filaments 34 illustrated in FIG. 2 are one implementation of the cathodes 8 shown in FIG. 1 and are for exemplary purposes only. The actual number and size of filaments 34 is determined in accordance wih the considerations for emissive surface area discussed below.

Directly above the assembly of conductive blocks 32 and filaments 34 is a plate or assembly 36 operated to provide collection of vapor not separated by the extraction plates 24. The assembly 36 is typically grounded.

Surrounding the chamber 12 is a series of coils 38 supplied with current from a current source 40 to provide a magnetic field within the chamber 12 generally parallel to the direction of laser beam 22.

A sectional view, showing details of the present invention in better representation, is shown in FIG. 3. As shown there, the vapor source 28 includes a crucible 42 having ports 44 for a cooling fluid such as water. The crucible 42 contains a supply of uranium 46 which is melted and vaporized by the energy in electron beam 48 from a filament 50 and associated electrodes. The crucible 42, typically of copper, contacts the uranium metal 46 and is itself either directly connected to ground or connected to ground through the high impedance 30 as illustrated. This connects the point of vaporizaton 54 either directly to ground or to ground through a high impedance for purposes mentioned below.

Uranium vapor generated from the point of vaporization 54 expands radially upward into the region of the extractor plates 24 where it passes though a plurality of chambers 56 defined by side plates 58 which are electrically connected together, typically at the ends thereof near the pipes 14 or 16 illustrated in FIG. 1. Centrally within each chamber 56 is a shorter flat electrode 60 similarly extending within each chamber 56 substantially the length of the chamber 12. Each electrode 60 is connected together in circuit to the pulse source 26. Preferably, shadow shields 62 are placed on the ends of the plates 58 facing the vapor flow.

The plate 36, used for the collection of vapor not selectively ionized and extracted for collection onto plates 58, is placed sufficiently above the chambers 56 to make room for the assembly of filaments 34, tubes 33 and blocks 32. As shown in FIG. 3, the filaments 34 are typically provided in short sections, each extending circumferentially about the point of vaporization, an angle substantially coextensive with the angle formed between each set of plates 58 in each chamber 56. The filaments 34 are supported from the blocks 32. Current is supplied to them from a heater supply 66 along appropriate connection busses 68 and 70.

Since the filaments 34 are likely to run hottest in the center and cooler towards the ends, they are shielded by enclosures 72 at the points where they approach the blocks 32 in order to prevent the collection of uranium vapor at these cooler parts for purposes explained below. Reference is here made to FIG. 3A for an expanded view of the supports.

The filaments 34 are operated as electron sources and are preferably but not necessarily for purposes of the invention run at a temperature which permits the formation of a coating of uranium condensed from the vapor in equilibrium with continuous revaporization of the uranium so that only a thin layer, or incomplete monolayer of uranium collects on the filaments 34. This insures a sufficient area of hot uranium to vastly improve the emissivity of the filaments 34, as by as much as more than several orders of magnitude, but at the same time prevents the build-up of a layer of uranium which would ultimately penetrate the tungsten filament 34 and cause its early failure. In order to insure this condition, the tungsten wire 34 is advantageously operated in the temperature range of 2500°-3000° K. by the heating effect of current from the heater 66.

In such case, two substantial benefits accrue, the surface area required for the desired electron emissivity can be greatly reduced in combination with a reduction in the required heater power. For an exemplary case where it is desired to provide approximately one ampere of electron current per cm of length in each chamber between plates 58 and where the vapor flow provides a vapor density of approximately $3\times10^{13}$ particles per $cm^3$, a typical surface area of 0.1 $cm^2$ per cm of chamber length may be used with the uranium coated filament. In addition, a heater power sufficient to maintain the above-stated temperature range at the emitting surface may be achieved with available technology. Such values above are intended to be exemplary only, to indicate the relative improvement achieved with the device described above. Other operating points within an acceptable operating range which provide a partial monolayer coating may be chosen. The filament structure shown above may alternatively be located on the opposite side of plates 58, in the region of line 73.

With reference to FIG. 4, there is shown an altenative embodiment for an electron emission surface. The view of FIG. 4 is a sectional diagram representative of several locations along each of the plates 58. These structures include a generally O-shaped channel member 80 which typically extends the length of the plate 58. Member 80 may typically be of copper or other thermally conductive material and includes a cooling port 82 for the flow of a cooling liquid such as water. Within a bottom portion of the O-shaped channel member 80 is an insulator 84 supported on first and second rods 86 and 88, running the length of the plates 58, and carrying electrical energization for a plurality of filaments 90 which, at several locations, extend above the O-shaped channel member 80. Each filament 90 extends into the cavity of a corresponding one of plural inverted enclosures 92. Each enclosure 92 is typically formed of tungsten and has electron emitting surfaces provided by a plurality of tungsten fins 94 extending at an acute angle outward from vertical sides 96 of the enclosure 92.

The filament 90 is energized by current from a filament energization source 100 through the rods 86 and 88. Heating of the enclosure 92 and particularly of the fins 94 is preferably achieved by drawing a space charge limited electron current from the filament 90 to the enclosure 92. For this purpose, the enclosure 92 is electrically connected and supported by plates 102 surrounding filament 90 and extending into and contacting the O-shaped channel member 80. An electron current source 104 is then provided to supply power for an electron beam current from the filament 90 to the enclosure 92 via the O-shaped channel member 80. Typical dimensions for the structure of FIG. 3 are a one centimeter diameter for the enclosure 92. Typical frequencies of placement are governed by the above exemplary figures for the filamentary source. The structure of FIG. 4 thus provides a very efficient and compact source for supplying electrons to the plasma.

With the structure described above which provides an efficient source of electrons to the plasma environment created by isotopically selective photoexcitation and ionization, circuitry according to the present invention may be described with respect to FIGS. 3 and 5, which circuitry is operative for providing the extraction potential that accelerates the ions within the chambers 56 toward collection plates 58 with suppression of the electron current from the vapor source 28.

As shown in FIG. 3, the pulse source 26 includes a voltage source 110 having a positive terminal thereof connected through a switch 112 to the anode plate 60 within the chamber 56. The plate 58 may also be connected to the voltage source 110 through the switch 112 and through a resistor 114 or may be connected directly to ground. It may also be left floating as is more fully explained below. The negative potential from the voltage source 110 is applied to one side of the heater supply 66 to connect the potential to the filament 34. At the same time, the melt 46 of uranium being vaporized is connected through the crucible either directly to ground or through the resistor 52 to ground as explained above. These arrangements of voltage application are employed in order to remove the melt as a source of electrons because the electrons, streaming from the melt 54 with the vapor flow into the chamber 56 create over-energization or de-energization of the vapor to the point where an undesirable number of ground and lower energy state particles are energized and made unavailable for selective photoionization or de-energized from selectively excited levels.

With reference to FIG. 5, the operation of this electrical energizaton structure is more clearly illustrated. As shown in FIG. 5, the plates 58, 60, 36, as well as filament 34 all contact the plasma generated within the chambers 56 with the equivalent of a diode characteristic represented by the diodes 116. These diodes represent the fact that the plates can effectively receive electrons from the plasma but unless they are otherwise an electron emitting surface, will not contribute electrons to the plasma. The filament 34 being operated as an electron emissive surface can contribute electrons as accordingly represented with a parallel combination of an additional, oppositely directed diode 118 and series voltage drop 120. The voltage drop 120 represents a simplification of space charge and resistance effects which must be overcome for conduction to occur. With the configuration illustrated in FIG. 3 and with the melt grounded along with the plates 58, the extraction potential is applied directly to the plasma environment through the filaments 34 on the one hand, and on the other through the anode plates 60. In this configuration, the cathode represented by the filaments 34 is effectively floated with respect to circuit common which includes the collector plate 36 and the uranium supply 46. In this configuration, current will be drawn through the plasma between the filament 34 and the plates 60.

In this circumstance, although the vapor source is essentially out of the circuit, there is still a potential for drawing some, although a greatly reduced, electron current from the vapor source to the anode plates 60, this current is a consequence of electrons flowing from the filament 34 to the plates 58 instead of the plates 60. That current is then balanced by an electron flow from the vapor source to the anodes 60. A reduction in this effect can be achieved by connecting the collecting plates 58 to the anodes 60 throught the resistor 114 as illustrated or by allowing them completely to float.

In addition, it is important to prevent the collection plates 36, which are in circuit ground, from serving a purpose similar to that of plates 58. This effect can be reduced by allowing the uranium supply 46 to float or partially float as by connecting it through the impedance 52 to ground. A limitation upon the degree to which benefit may be achieved is the secondary or skip electrons generated from bouncing of the electrons in the beam 48 from the surface of the melt 46. The electrons thus released contribute to a current flow from the melt to ground which may make a truly floating melt or vapor source difficult to obtain.

Nevertheless, the structure illustrated above is effective to greatly reduce the electron current drawn from the melt, and to supply instead electrons from the filament 34 or cathode 92. This results in greatly reducing the superenergization of the vapor flow before it is selectively photoexcited and ionized, and reducing de-energization and loss of selectively excited particles. The voltage applied in pulses to the chambers 56 for acceleration of the ions for collection on the plates 58 is also assured a supply of electrons for sufficient operation as is more fully described in the above-referenced U.S. Pat. No. 3,939,354.

The above-described preferred embodiment of the present invention is presented in exemplary structure for purposes of illustration and not by way of limitation. Alterations and modifications are intended to fall within the scope of the invention as is only limited in accordance with the following claims.

What is claimed is:

1. In a system for photoionizing particles generated by a vapor source and for accelerating the ionized particles onto predetermined trajectories wherein the vapor source is capable of functioning to provide electrons to the vapor, apparatus for providing the accelerating forces in a manner to inhibit the flow of electrons from the vapor source comprising:
  - an anode located within the plasma generated by ionization of said vapor;
  - a cathode located within said vapor;
  - means for generating said vapor including electrons and directing it into the region of said anode;
  - means for photoionizing said vapor in the region of said anode;
  - voltage source means for providing electrical potential between said anode and said cathode to accelerate the selectively ionized particles through a circuit of which thereby includes said plasma; and
  - means for permitting said circuit to acquire a potential substantially independent of said vapor source to suppress the flow of electrons from said vapor source to said circuit.

2. The apparatus of claim 1 further including means for producing electron emission from said cathode to said plasma.

3. The apparatus of claim 1 wherein:
  - a conducting enclosure is provided for said vapor, said enclosure defining circuit common;
  - said vapor source is isolated form said circuit common.

4. The apparatus of claim 3 wherein said vapor source includes means for vaporizing an electrically conductive material and means for connecting said electrically conductive material to circuit common.

5. The apparatus of claim 4 further including:

means for collecting unaccelerated components of said vapor; and means for conecting said collecting means to circuit common.

6. The apparatus of claim 5 wherein said means for connecting said electrically conductive material to circuit common includes a high impedance between said material and circuit common.

7. The apparatus of claim 6 wherein said material to be vaporized includes uranium.

8. The apparatus of claim 1 further including a plurality of plates within said vapor environment having a predetermined spaced relationship to said anode.

9. The apparatus of claim 8 wherein:

a chamber having a predetermined potential is provided surrounding said vapor environment; and said plurality of plates are connected to said predetermined potential apart from the circuit defined by said voltage source, said anode and said cathode.

10. The apparatus of claim 8 including means for connecting said plurality of said plates to said anode through a high impedance.

11. The apparatus of claim 8 including means for electrically isolating said plurality of plates with respect to the circuit defined by said voltage source, said anode and said cathode.

12. The apparatus of claim 1 wherein said vapor source includes an electron beam evaporator and a supply of uranium to be evaporated thereby.

13. The apparatus of claim 1 further including:

means other than said source for supplying electrons to said plasma;

means for applying a magnetic field in the region between said anode and cathode.

14. The apparatus of claim 13 wherein the magnetic field is applied orthogonal to the field lines between the anode and cathode resulting from the applied electrical potential.

15. Apparatus for applying an accelerating force in the region of a plasma environment between a plurality of plates to direct plasma particles toward one or more of the plates comprising:

means for generating a vapor environment including electrons having a predetermined flow direction;

means for photoionizing said vapor to generate a plasma;

a plurality of conductive plates within said plasma and spaced to define at least one chamber between said plates in the path of flow of said plasma;

an anode electrode within the at least one chamber;

means for generating a set of equipotential surfaces surrounding said anode in a series of successively lower potential levels outwardly from said anode;

means for permitting said plates to assume a potential substantially independent of said anode at a level of potential in the series of successively lower potential levels at which said plates are inhibited from drawing a current through said plasma; and means for directing charged plasma particles toward at least one of said plates in the presence of said equipotential surfaces.

16. The apparatus of claim 15 wherein said directing means includes means for applying a magnetic field within said at least one chamber.

17. The apparatus of claim 16 wherein:

said plates and said anode extend substantially parallel to each other in a direction; and said magnetic field is applied parallel to said direction.

18. The apparatus of claim 15 wherein said equipotential generating means generates said equipotential surfaces in pulses.

19. The apparatus of claim 15 wherein said floating means includes at least a high impedance.

20. The apparatus of claim 15 wherein said generating means includes:

a cathode in said plasma environment; and means for applying an electric potential between said anode and said cathode to provide said equipotential surfaces.

21. The apparatus of claim 20 further comprising means for providing electron emission from said cathode.

22. The apparatus of claim 15 further comprising:

inhibiting means for permitting a charge accumulation between said vapor generating means and said at least one chamber that inhibits the flow of electrons from said vapor generating means to the region of said at least one chamber.

23. The apparatus of claim 15 wherein said permitting means includes means for providing electrical isolation between said anode and said plasma generating means.

24. The apparatus of claim 23 wherein said permitting means further includes means for providing electrical isolation between said plates and said anode.

25. The apparatus of claim 24 wherein at least one of said isolating meand includes at least a high impedance.

26. The apparatus of claim 15 wherein said charged particles include uranium ions.

27. A process of applying an accelerating force in the region of a vapor plasma environment between a plurality of plates to direct palsma particles toward one or more of the plates comprising the steps of:

photoionizing a vapor to generate said plasma environment including electrons having a predetermined flow toward at least one chamber defined between a plurality of spaced plates and containing an electrode;

generating equipotential surfaces surrounding said electrode in a series of successively lower potential levels outwardly from said electrode;

permitting said plates to assume a potential substantially independent of said electrode at a level of potential in the series of successively lower potential levels at which said plates are inhibited from drawing a current from said plasma; and directing charged plasma particles toward at least one of said plates in the presence of said equipotential surfaces.

28. Apparatus for collecting particles in a plasma comprising:

separation apparatus comprising:

a set of elongated parallel anodes;

circuit means for generating equipotential surfaces around said anodes;

a vapor source for providing a flow of vapor particles including electrons directed over a distance toward said separation apparatus;

means for producing isotopically selective photoionization of vapor particles in the region of said anodes;

a plurality of plates surrounding said anodes to provide elongate channels in which said isotopically selective photoexcitation occurs;

magnetic field means operative in associaton with the equipotential surfaces for causing said selectively ionized particles to collect on said plates;

means for generating a supply of electrons in the region of said photoionization without said electrons having to flow with said vapor particles;

means for permitting said circuit means and said plural plates to acquire a potential independent of each other and said vapor source so as to inhibit the flow of electrons from said vapor source thereto.

* * * * *